(12) United States Patent
Balasubramaniam et al.

(10) Patent No.: US 7,344,993 B2
(45) Date of Patent: Mar. 18, 2008

(54) LOW-PRESSURE REMOVAL OF PHOTORESIST AND ETCH RESIDUE

(75) Inventors: Vaidyanathan Balasubramaniam, Richardson, TX (US); Yasunori Hatamura, Salem, MA (US); Masaaki Hagihara, Peabody, MA (US); Eiichi Nishimura, Malden, MA (US); Koichiro Inazawa, deceased, late of Peabody, MA (US); by Rie Inazawa, legal representative, Hokuto (JP)

(73) Assignee: Tokyo Electron Limited, Inc., Tokyo (JP)

( * ) Notice: Subject to any disclaimer, the term of this patent is extended or adjusted under 35 U.S.C. 154(b) by 276 days.

(21) Appl. No.: 11/032,021

(22) Filed: Jan. 11, 2005

(65) Prior Publication Data

US 2006/0154486 A1    Jul. 13, 2006

(51) Int. Cl.
*H01L 21/302*  (2006.01)
(52) U.S. Cl. .................... 438/706; 438/710; 438/725; 438/727; 257/E21.256
(58) Field of Classification Search ............... None
See application file for complete search history.

(56) References Cited

U.S. PATENT DOCUMENTS 6,551,447 B1*  4/2003  Savas et al. ........... 156/345.48
2003/0054656 A1*  3/2003  Soda ........................ 438/710
2003/0194876 A1* 10/2003  Balasubramaniam et al. ....................... 438/725
2004/0104358 A1*  6/2004  Moroz ..................... 250/492.2
2004/0171273 A1*  9/2004  Oyama et al. ............ 438/710
2006/0051947 A1*  3/2006  Lin et al. .................. 438/597

* cited by examiner

Primary Examiner—Michael Lebentritt
Assistant Examiner—Kyoung Lee
(74) Attorney, Agent, or Firm—Oblon, Spivak, McClelland, Maier & Neustadt, P.C.

(57) ABSTRACT

A method is provided for plasma ashing to remove photoresist remnants and etch residues formed during preceding plasma etching of dielectric layers. The ashing method uses a two-step plasma process involving a hydrogen-containing gas, where low or zero bias is applied to the substrate in the first cleaning step to remove significant amount of photoresist remnants and etch residues from the substrate, in addition to etching and removing detrimental fluorocarbon residues from the chamber surfaces. An increased bias is applied to the substrate in the second cleaning step to remove the remains of the photoresist and etch residues from the substrate. A chamber pressure less than 20 mTorr is utilized in the second cleaning step. The two-step process reduces the memory effect commonly observed in conventional one-step ashing processes. A method of endpoint detection can be used to monitor the ashing process.

43 Claims, 6 Drawing Sheets

LOW-PRESSURE REMOVAL OF PHOTORESIST AND ETCH RESIDUE

CROSS-REFERENCE TO RELATED APPLICATIONS

The present application is related to co-pending U.S. patent application Ser. No. 10/259,381, filed on Sep. 30, 2002, the entire contents of which are herein incorporated by reference. The present application is related to copending U.S. patent application entitled "LOW-PRESSURE REMOVAL OF PHOTORESIST AND ETCH RESIDUE", filed on Dec. 30, 2004, the entire contents of which are herein incorporated by reference.

FIELD OF THE INVENTION

The present invention relates to plasma processing, particularly to cleaning and removal of photoresist and etch residues following an etching process in semiconductor microfabrication.

BACKGROUND OF THE INVENTION

Plasma processing systems are used in the manufacture and processing of semiconductors, integrated circuits, displays and other devices or materials, to both remove material from or to deposit material on a substrate such as a semiconductor substrate. Plasma processing of semiconductor substrates to transfer a pattern of an integrated circuit from the photolithographic mask to the substrate, or to deposit dielectric or conductive films on the substrate, has become a standard method in the industry.

In semiconductor processing, where various types of films are etched, integration challenges and trade-offs still remain. Conventionally, a dielectric layer is patterned with openings for depositing conductive materials to form vertical contacts. During the patterning process, etch resistant photoresist layer and/or a hard mask layer is deposited over the dielectric layer, exposed to a selected pattern, and developed. The layered structure is then etched in a plasma environment where the patterned photoresist layer defines openings in the dielectric layer.

Following the etching step, photoresist remnants and etch residues (e.g., polymer debris) are frequently observed on the etched features and chamber surfaces. One of the integration challenges in plasma cleaning (also known as in-situ ashing), is to successfully remove photoresist remnants and etch residues, while avoiding erosion of surrounding layers. Known systems have used a one-step ashing process in which the bias applied to the substrate is maintained constant throughout the ashing process.

Halocarbon gases are commonly used in the etching of dielectric layers, such as oxides and newer SiOC-containing, low-k, dielectric materials. These gases are known to generate fluoro-carbon polymer etch products that can deposit on the internal surfaces of the process chamber, as well as on the substrate surface, during the dielectric etching process.

FIG. 1 shows a schematic cross-sectional representation of a one-step ashing process. During a conventional one-step ashing process for removing photoresist 106 from structure 100, fluorocarbon polymers are released/etched from the chamber walls (commonly referred to as a memory effect) and can attack underlying dielectric layer 104 and cap layer 102 (e.g., SiN, SiC), leading faceting 108 of the dielectric layer and cap layer loss 110, sometimes even punching through the cap layer 102 and attacking the underlying conductive layer (e.g., copper, not shown). This effect can be high at the edges of a wafer due to the high fluoro-carbon polymer concentration near the chamber walls. Alternatively, the structure 100 can also contain fluoro-carbon polymer deposits.

During a conventional one-step ashing process, photoresist can be removed in a hydrogen-containing plasma. To avoid post-ashing residue formation, some bias power is applied to the substrate holder. During this process, the fluoro-carbon deposits on the chamber walls from the preceding dielectric etch are also etched, releasing fluorine radicals in the plasma. As the bias is applied to the substrate holder, these fluorine radicals can erode the underlying dielectric film and consume the cap layer. By reducing the bias or applying zero bias, dielectric film erosion and cap layer consumption can be reduced but post-ashing residue can still be observed.

A conventional one-step ashing process that can result in the above chamber problems can involve the following plasma process conditions: Chamber pressure=50 mTorr, RF bias=150 W, and $O_2$ flow rate=200 sccm.

In semiconductor manufacturing, the conventional one-step ashing process is frequently carried out in a process chamber where the internal chamber surfaces (and the substrate to be ashed) can contain fluoro-carbon-based polymer deposits from a preceding dielectric etching process. Alternatively, the one-step ashing process can be carried out in a process chamber that has been cleaned of polymer deposits from a prior etching process.

SUMMARY OF THE INVENTION

It is an object of the invention to provide a plasma processing method for removing photoresist remnants and etch residues from a substrate with reduced erosion of the surrounding substrate layers compared to one-step ashing.

The above and other objectives are accomplished using a two-step in-situ plasma ashing process utilizing a process gas comprising a hydrogen-containing gas. During the first ashing step, a first low or zero bias level is applied to the substrate holder upon which a substrate resides, while a second bias level is applied during the second ashing step. The pressure in the plasma processing chamber in the second ashing step is less than 20 mTorr.

During the first ashing step, where low or zero bias is applied to the substrate, a significant amount of photoresist remnants and etch residues on the substrate and internal surfaces/walls of the process chamber are etched and removed from the chamber, while erosion of the remaining substrate layers is minimized. During the second ashing step, an increased bias is applied and the ashing process is continued until the photoresist remnants and etch residues are removed.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF AN EMBODIMENT

Figure 1:
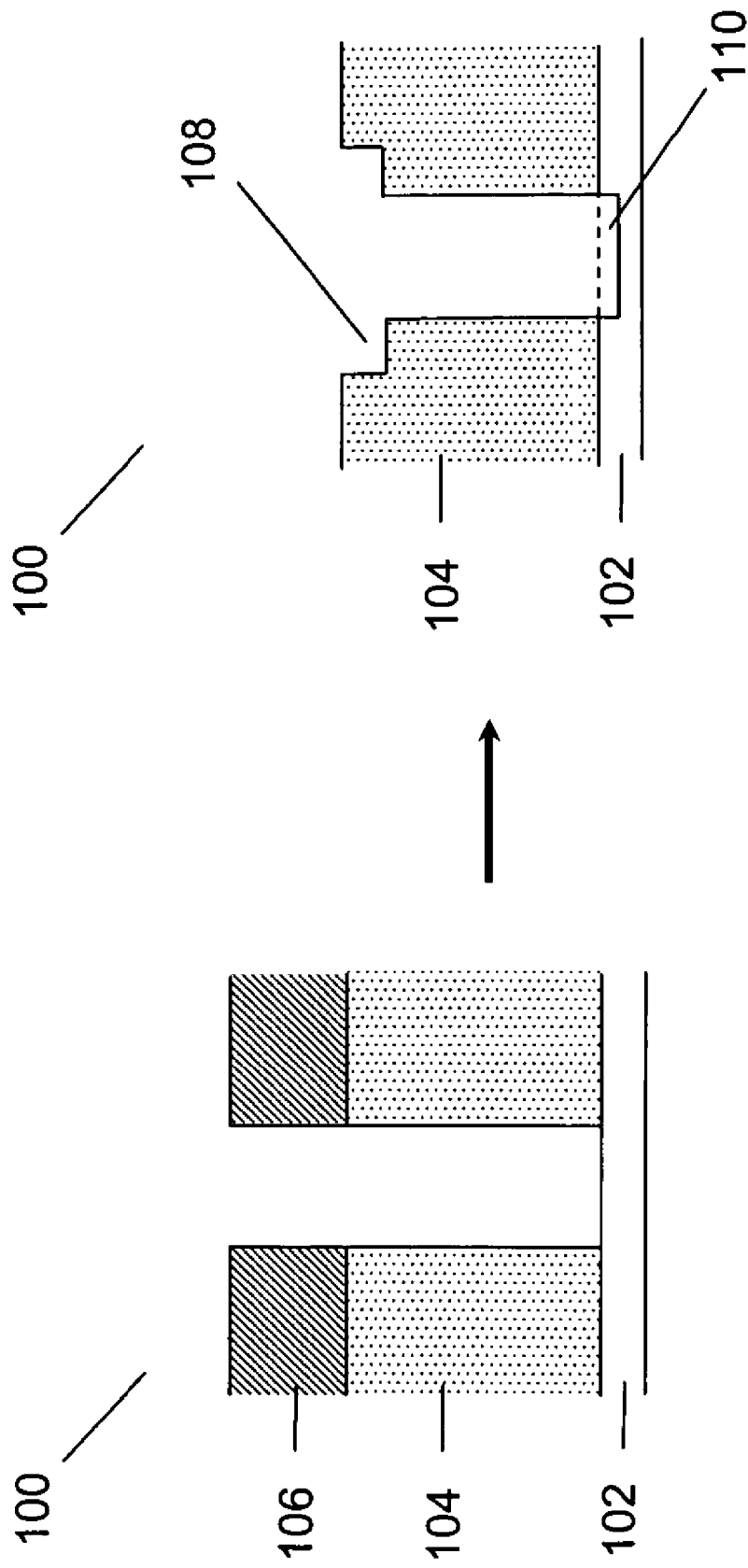
FIG. 1 shows a schematic cross-sectional representation of a one-step ashing process.

The inventors of related U.S. patent application Ser. No. 10/259,381, entitled METHOD FOR REMOVING PHOTORESIST AND ETCH RESIDUE, which are the inventors of the present application, realized that a two-step plasma ashing process can be utilized to remove photoresist remnants and etch residues from a substrate. During the first ashing step, where zero or low bias is applied to a substrate holder upon which a substrate resides, a significant amount of photoresist remnants and etch residues, from preceding etch processes that can, for example, utilize $C_xF_y$ etch gases, are etched and removed from the processing chamber with minimal erosion of the remaining substrate layers. During the second ashing step, an increased bias is applied to the substrate holder and the ashing process is continued until the photoresist and/or hard mask remnants, and post-ash residues are removed.

The current inventors have realized that the above-mentioned two-step plasma ashing process can be improved by performing the second ashing step at a low pressure in the plasma processing chamber. The low pressure can reduce damage to underlying dielectric substrate layers, for example low dielectric constant (low-k) materials such as SiOC materials (k~2.7). Damage to the low-k materials can include increase in the dielectric constant of the materials, thereby reducing the advantage of using these materials over conventional higher dielectric constant materials. According to an embodiment of the invention, low concentration of hydrogen radicals in the plasma environment at low processing chamber pressure can reduce or eliminate damage of the dielectric material during the ashing process. In addition, unlike the concentration of hydrogen radicals, ion flux from the plasma to the substrate is relatively constant over the pressure range of the current invention. High ion flux can enable high ashing rate and short ashing time, thereby increasing substrate throughput. In addition, lowering the chamber pressure results in more directional (anisotropic) ion bombardment of the substrate layers, thereby reducing the damage to sidewalls of patterned dielectric layers during an ash process.

Thus, according to an embodiment of the invention, a process pressure less than 20 mTorr is utilized in the processing chamber during the second ashing step of the two-step ashing process. According to another embodiment of the invention, a process pressure less than about 10 mTorr can be utilized in the processing chamber during the second ashing step.

A two-step, in-situ, ash process in the current invention can alleviate many of the above shortcomings by satisfying at least one of: 1) minimizing cap layer consumption; 2) minimizing dielectric faceting/erosion at the top of features and reducing post-etch/critical-dimension (CD) bias; 3) minimizing post-ash residues; 4) minimizing damage (reduction in "k" value) to low-k dielectric films during in-situ ashing; and 5) providing automatic chamber dry cleaning, thereby increasing mean-time-between-chamber cleaning.

Figure 2:
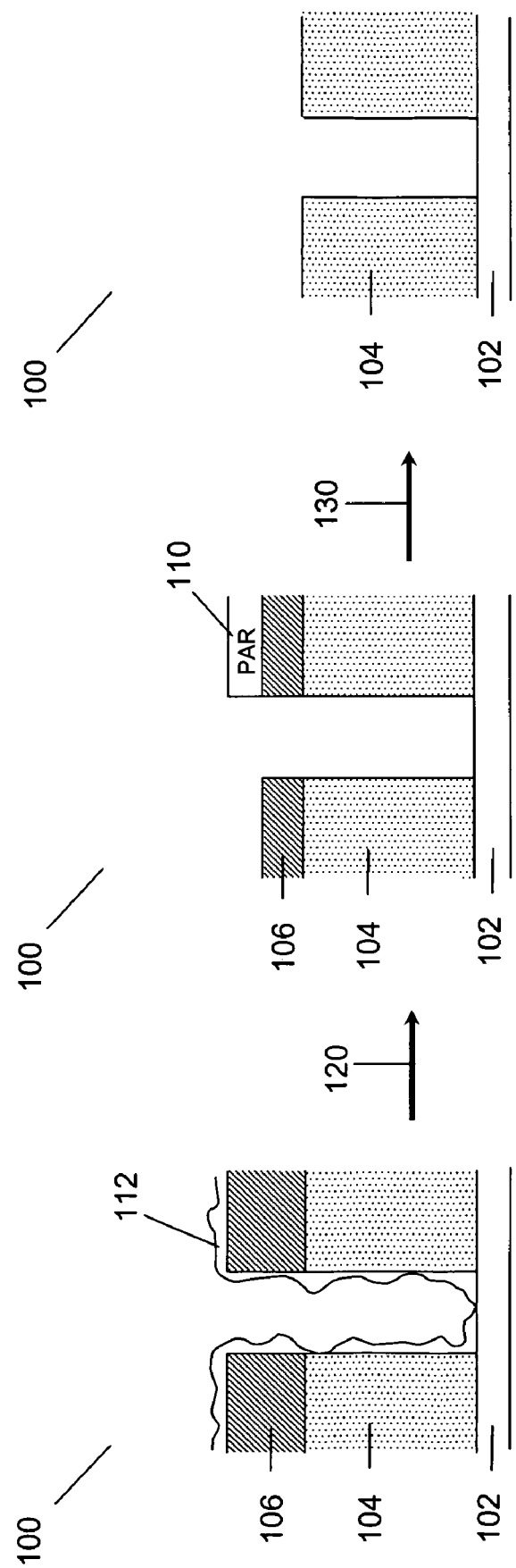
FIG. 2 shows a schematic cross-sectional representation of a two-step ashing process.

FIG. 2 shows a schematic cross-sectional representation of a two-step ashing process. During the first ashing step 120, of a two-step, hydrogen-containing, ashing process, the photoresist 106 on the wafer and fluorocarbon polymers 112 deposited on the chamber walls and wafer are etched. As a zero or low bias is applied, erosion of the dielectric layer 104 and consumption of the cap layer 102 are minimized. During the first ashing step 120, the chamber is dry cleaned of any polymer residues. The length of the first ashing step 120 can be based on time, possibly leaving a small amount of post-ash residue 110, or PAR, and possibly a small amount of photoresist 106 on the substrate.

During the second ashing step 130, a bias is applied, and the ashing is carried out for a time sufficient to remove any post-ash residue 110 and any remaining photoresist 106.

The current invention can, for example, be carried out using a plasma processing system containing a capacitively coupled plasma source having an upper electrode and a lower electrode. The upper electrode can, for example, further function as a showerhead for introducing a process gas into the processing chamber, and the lower electrode can be a substrate holder configured to support a substrate to be processed and to apply a bias to the substrate. Capacitively coupled plasma sources are well known to persons skilled in the art. The current invention can also be carried out using other types of plasma sources including, as a non-limiting example, an inductive coupling plasma sources (ICP).

Exemplary process parameters for the first ashing step of the two-step ashing process according to embodiments of the current invention will now be described. In one embodiment of the invention, the chamber pressure can be between about 1 mTorr and about 1000 mTorr. According to another embodiment of the invention, the chamber pressure can be between about 5 mTorr and about 50 mTorr. A process gas flow rate of about 5 sccm to about 1500 sccm can be used in the processing chamber. A process gas containing a hydrogen-containing gas (e.g., $H_2$, $NH_3$, or a combination thereof) can be used alone, but it may also be used in conjunction with an inert gas (e.g., a noble gas (e.g., He, Ar, etc.) or $N_2$). The flow rate of the hydrogen-containing gas can, for example, be between about 5 sccm and about 500 sccm and the inert gas flow rate can, for example, be between about 0 sccm and about 1000 sccm. The bias power (lower electrode power) can, for example, be between about 0 W and about 100 W. An upper electrode power, can, for example, be between about 500 W and about 2200 W, and the substrate temperature can be between about −10° C. and about 250° C.

In one example, the process parameters for the first ashing step included a chamber pressure of 20 mTorr, an Ar gas flow rate of 550 sccm, an $H_2$ gas flow rate of 200 sccm, an upper electrode power of 300 W, and a lower electrode power of 0 W. The time duration of the first ashing step can, for example, be about 35 sec.

In the second ashing step of the two-step ashing process, the process parameters can include the same conditions described above for the first ashing step, except that the chamber pressure in the second ashing step is less than 20 mTorr. In an embodiment of the invention, the chamber pressure in the second ashing step can be less than about 10 mTorr. In another embodiment of the invention, the chamber pressure in the second ashing step can be less than about 5 mTorr. A bias between about 50 W and about 1000 W can be used, where the bias applied to the substrate holder in the second ashing step (second bias) is greater than the bias applied to the substrate holder in the first ashing step (first bias).

Although a Radio-Frequency, or RF, bias is disclosed as being used, a DC bias may also be used or may be used instead of a RF bias. Additionally, chamber pressure can be varied during the ashing process. For example, the chamber pressure can be varied from the first step to the second step. Furthermore, the composition of the process gas can be varied during the ashing process. For example, the process gas (and flow ratios of different gases in the process gas) can be varied from the first step to the second step.

Alternatively, during the two-step process, a bias can be applied when substantially all (but not all) of the polymer has been removed from the chamber in order to increase throughput, but at a cost of reintroducing some of the effects of the conventional one-step process.

Furthermore, although described above as using only a single bias, a varying bias can be used instead. For example, the bias may be increased (either continuously or stepwise (e.g., in increments of 10 W)) from 0 W to about 100 W, before, during, or after the second step.

As described above, the time duration for the first step should be sufficiently long to complete the removal of fluoro-carbon material from the chamber walls and wafer surface. For example, the time duration for the first step can range from 20 sec to 50 sec. Similarly, the time duration for the second step should be sufficiently long to remove any post-ash residue and any remaining photoresist. For example, the time duration for the second step can range from 20 sec to 50 sec.

Alternatively, in the two-step ashing process in FIG. 2, the end of the first step 120 and the second step 130 can be determined using endpoint detection. One possible method of endpoint detection is to monitor a portion of the emitted light spectrum from the plasma region. For example, portions of the spectrum that indicate such a removal have wavelengths of 482.5 nm (CO), 775.5 nm (F), and 440 nm ($SiF_4$), and can be measured using Optical Emission Spectroscopy (OES). After emission levels corresponding to those frequencies cross a specified threshold (e.g., drop to substantially zero or increase above a particular level), the first step is considered to be complete. Other wavelengths that provide endpoint information can also be used.

After the end of the first step, the second step preferably utilizes a 50-200% overash to remove any remaining post-ash residue (PAR). That is, if the first step is completed in 50 sec, the second step would be 25 sec for a 50% overash and 50 sec for a 100% overash. The actual amount of overash can be determined empirically by examining a series of substrates that are overashed to different degrees.

Substrates can be evaluated following an ashing process, for example, by measuring loss of cap layer, dielectric sidewall loss, and dielectric faceting/erosion at the top of features. Process conditions that enable the desired ashing, while minimizing the above losses and erosion, can be determined by direct experimentation and/or design of experiments.

Figure 3:
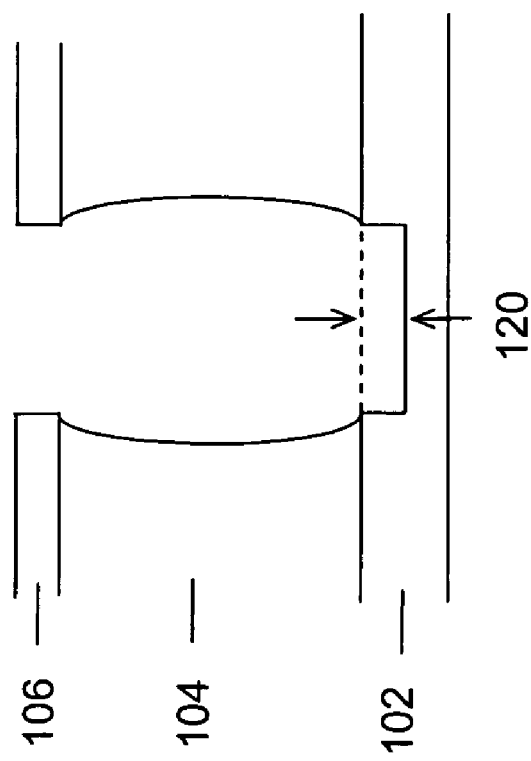
FIG. 3 schematically shows loss of a cap layer during an ashing process.

In a first example, FIG. 3 schematically shows a loss of cap layer during an ashing process. Cap layer loss 120 is measured as the thinning of a cap layer 102 in a scanning electron micrograph (SEM) image, following an ashing process of the dielectric layer 104. Process conditions that enable the desired ashing, while minimizing cap layer loss 120, can be determined by direct experimentation and/or design of experiments (DOE).

Figure 4:
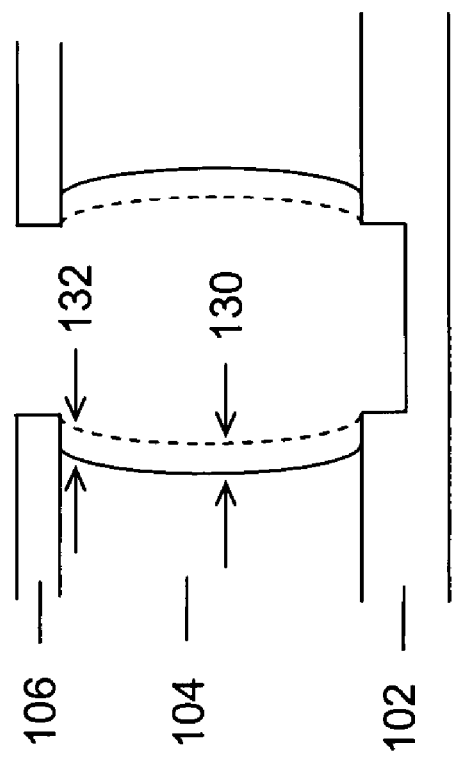
FIG. 4 schematically shows dielectric sidewall loss.

In a second example, FIG. 4 schematically shows a dielectric sidewall loss. For example, the dielectric sidewall loss in FIG. 4 can be measured as dielectric removal at the top 132 and middle 150 of the dielectric layer 104 after exposure to a HF solution. The structures in FIGS. 3 and 4 can further comprise a SiN layer 106 and a SiC 102 layer. To measure the sidewall loss, the plasma ashed substrates can be exposed to a 0.5% HF solution for a time period of about 5 sec to 30 sec. Subsequent SEM analysis of the substrates can be used to evaluate the sidewall loss.

Examples of the use of endpoint detection to determine when all (or substantially all) of the polymer (and possibly the photoresist) has been removed from the chamber, along with examples for evaluating ashed substrates by measuring cap layer loss and sidewall loss, are fully described in co-pending U.S. patent application Ser. No. 10/259,381.

Figure 5:
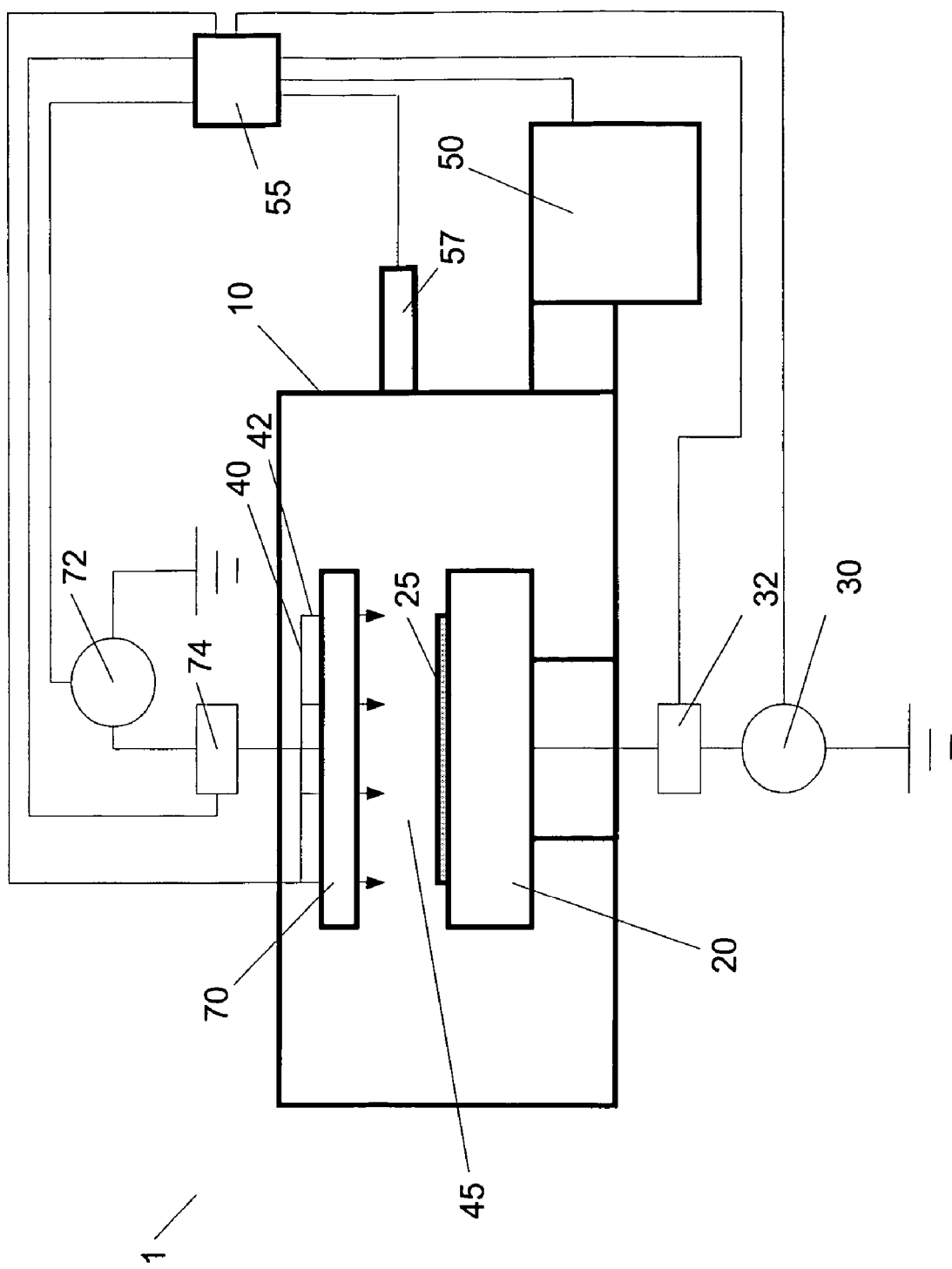
FIG. 5 shows a plasma processing system according to an embodiment of the present invention.

FIG. 5 shows a plasma processing system according to an embodiment of the present invention. The plasma processing system 1 is configured to facilitate the generation of plasma in a processing region 45 of the process chamber 10. The plasma processing system 1 further comprises a substrate holder 20, upon which a substrate 25 to be processed is affixed and makes electrical contact to, and a gas injection system 40 for introducing process gas 42 to the plasma process chamber 10, and a vacuum pumping system 50. The gas injection system 40 allows independent control over the delivery of the process gas 42 to the process chamber 10 from external gas sources.

An ionizable process gas 42 is introduced via the gas injection system 40 and the process pressure is adjusted. The flow rate of the process gas can be between about 10 sccm and about 5000 sccm, alternately between about 20 sccm and about 1000 sccm, and still alternately between about 50 sccm and about 500 sccm. The chamber pressure can, for example, be between about 1 mTorr and about 200 mTorr, alternately between about 5 mTorr and about 100 mTorr, still alternately between about 10 mTorr and about 50 mTorr. The controller 55 can be used to control the vacuum pumping system 50 and gas injection system 40. Substrate 25 is transferred into process chamber 10 through a slot valve (not shown) and chamber feed-through (not shown) via a (robotic) substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the backside of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermoelectric heaters/coolers, are included in the substrate holder 20.

The plasma processing system 1 of FIG. 5 includes a RF plasma source that contains an upper plate electrode 70 to which RF power is coupled from a RF generator 72 through an impedance match network 74. A typical frequency for the application of RF power to the upper plate electrode 70 can range from 10 MHz to 200 MHz and can be 60 MHz. The RF power applied to the upper plate electrode 70 can be between about 500 W and about 2200 W. As noted above, the plasma processing system 1 of FIG. 5 further includes a RF source for applying RF power to the substrate holder 20 to bias the substrate 25. The RF source contains a RF generator 30 and an impedance match network 32 that serves to maximize the transfer of RF power from the plasma to the processing region 45 by minimizing the reflected power. Match network topologies (e.g., L-type, π-type, T-type) and automatic control methods are known in the art. A typical frequency for the application of power to the substrate holder 20 ranges from 0.1 MHz to 30 MHz and can be 2 MHz. The RF power applied to the substrate holder 20 can be between about 0 W and about 1000 W. Moreover, the controller 55 is coupled to the RF generator 72 and the impedance match network 74 in order to control the application of RF power to the upper plate electrode 70. In an alternate embodiment, RF power can be applied to the substrate holder 20 at multiple frequencies.

With continuing reference to FIG. 5, a process gas 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate. In one embodiment, the multi-orifice showerhead gas injection plate can be the upper plate electrode 70.

Vacuum pump system 50 can include a turbo-molecular vacuum pump (TMP) capable of a pumping speed up to 5000 liters per second (and greater), and a gate valve for throttling the chamber pressure. In conventional plasma processing devices utilized for dry plasma etch, a 1000 to 3000 liter per second TMP is employed. TMPs are useful for low pressure processing, typically less than 50 mTorr. For high pressure processing (i.e. greater than 100 mTorr), a mechanical booster pump and dry roughing pump are used.

The controller 55 includes a microprocessor, a memory, and a digital I/O port capable of generating control voltages sufficient to communicate and activate inputs to the plasma processing system 1 as well as monitor outputs from the plasma processing system 1. Moreover, the controller 55 is coupled to and exchanges information with the RF generator 30, the impedance match network 32, the RF generator 72, the impedance match network 74, the gas injection system 40, a plasma monitor system 57, and the vacuum pump system 50. A program stored in the memory is utilized to control the aforementioned components of a plasma processing system 1 according to a stored process recipe. One example of the controller 55 is a digital signal processor (DSP), model number TMS320, available from Texas Instruments, Dallas, Tex.

The plasma monitor system 57 can comprise, for example, an optical emission spectroscopy (OES) system to measure excited particles in the plasma environment and/or a plasma diagnostic system, such as a Langmuir probe, for measuring plasma density. The plasma monitor system 57 can be used with controller 55 to determine the status of the etching process and to provide feedback to ensure process compliance. Alternately, plasma monitor system 57 can comprise a microwave and/or a RF diagnostic system.

Figure 6:
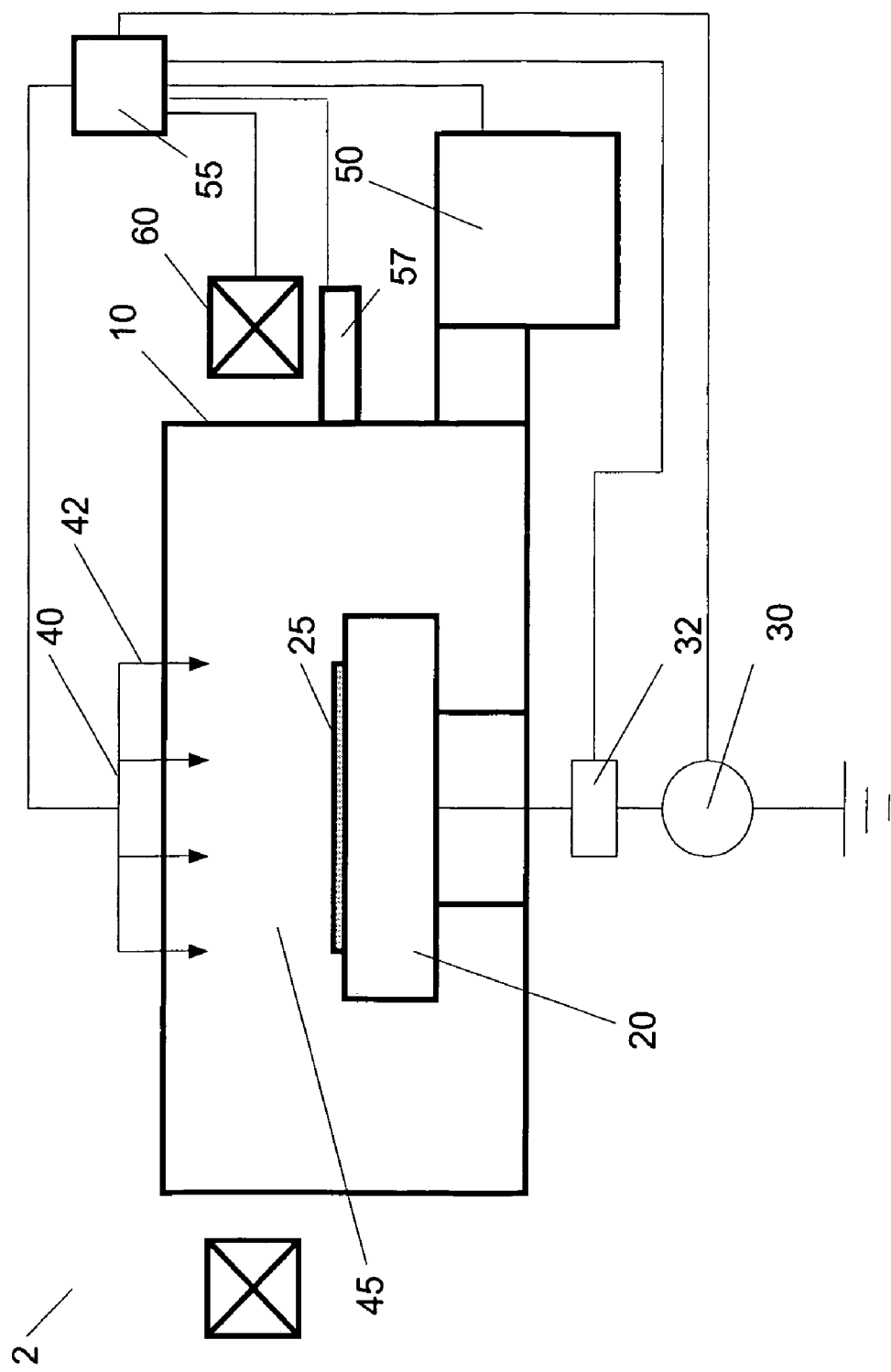
FIG. 6 shows a plasma processing system according to another embodiment of the present invention.

FIG. 6 shows a plasma processing system according to another embodiment of the present invention. The plasma processing system 2 includes a RF plasma source comprising either a mechanically or electrically rotating DC magnetic field system 60 in order to potentially increase plasma density and/or improve plasma processing uniformity. Moreover, the controller 55 is coupled to the rotating magnetic field system 60 in order to regulate the speed of rotation and field strength.

Figure 7:
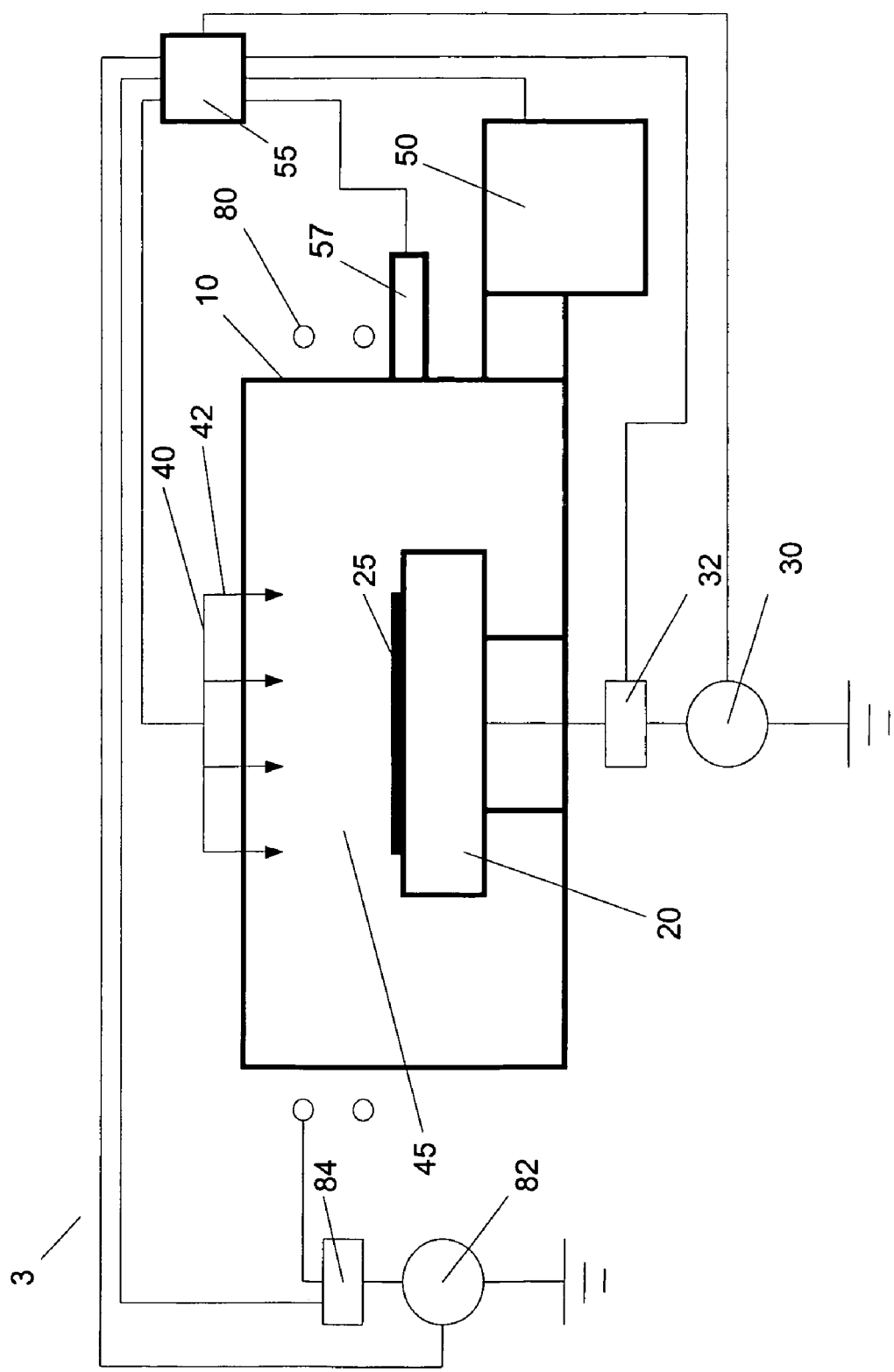
FIG. 7 shows a plasma processing system according to yet another embodiment of the present invention.

FIG. 7 shows a plasma processing system according to yet another embodiment of the present invention. The plasma processing system 3 includes a RF plasma source comprising an inductive coil 80 to which RF power is coupled via a RF generator 82 through an impedance match network 84. RF power is inductively coupled from the inductive coil 80 through a dielectric window (not shown) to the plasma-processing region 45. A typical frequency for the application of RF power to the inductive coil 80 ranges from 0.1 MHz to 100 MHz and can be 13.56 MHz. The RF power applied to the inductive coil can be between about 50 W and about 10000 W. Similarly, a typical frequency for the application of power to the chuck electrode ranges from 0.1 MHz to 30 MHz and can be 13.56 MHz. The RF power applied to the substrate holder can be between about 0 W and about 1000 W. In addition, a slotted Faraday shield (not shown) can be employed to reduce capacitive coupling between the inductive coil 80 and plasma. Moreover, the controller 55 is coupled to the RF generator 82 and the impedance match network 84 in order to control the application of power to the inductive coil 80.

In addition, it is to be understood that the plasma processing systems depicted in FIGS. 5-7 are shown for exemplary purposes only, as many variations of the specific hardware can be used to implement processing systems in which the present invention may be practiced, and these variations will be readily apparent to one having ordinary skill in the art.

Numerous modifications and variations of the present invention are possible in light of the above teachings. It is therefore to be understood that, within the scope of the appended claims, the invention may be practiced otherwise than as specifically described herein.

The invention claimed is:

1. A method of in-situ ashing, comprising:
   introducing a process gas containing a hydrogen-containing gas into a plasma processing chamber;
   generating a plasma in the plasma processing chamber;
   exposing a substrate to the plasma, the substrate residing on top of a substrate holder;
   performing a first ashing step by applying a first bias to the substrate holder; and
   performing a second ashing step by applying a second bias to the substrate holder, the second bias being greater than the first bias, wherein the chamber pressure in the processing chamber during the second ashing step is less than 20 mTorr.

2. The method according to claim 1, wherein the hydrogen-containing gas comprises $H_2$, $NH_3$, or a combination thereof.

3. The method according to claim 1, wherein the process gas further comprises an inert gas.

4. The method according to claim 1, wherein the inert gas comprises a noble gas, $N_2$, or a combination thereof.

5. The method according to claim 1, wherein the first bias is between about 0 W and about 100 W.

6. The method according to claim 1, wherein the first bias is substantially equal to zero.

7. The method according to claim 1, wherein the second bias is between about 50 W and about 1000 W.

8. The method according to claim 1, wherein the second ashing step further comprises utilizing at least one of chamber pressure, rate of process gas flow, or a combination of the pressure and the rate of process gas flow that is different from those used during the first ashing step.

9. The method according to claim 1, wherein the first ashing step further comprises:
detecting emitted light from the plasma; and
determining the status of the first ashing step from the emitted light.

10. The method according to claim 9, wherein the detecting of the emitted light provides means for establishing an endpoint.

11. The method according to claim 9, wherein the emitted light originates from an excited species and represents information on the status of the first ashing step.

12. The method according to claim 9, wherein the emitted light originates from at least one of CO, a fluorine-containing species, or a combination thereof.

13. The method according to claim 12, wherein the fluorine-containing species is fluorine.

14. The method according to claim 1, wherein the second ashing step further comprises:
detecting emitted light from the plasma; and
determining a status of the second ashing step from the emitted light.

15. The method according to claim 14, wherein the emitted light originates from an excited species and represents information on the status of the second ashing step.

16. The method according to claim 15, wherein the emitted light originates from at least one of CO, a fluorine-containing species, or a combination thereof.

17. The method according to claim 16, wherein the fluorine-containing species is fluorine.

18. The method according to claim 1, further comprising:
detecting emitted light from the plasma; and
determining a status of the first and second ashing steps from the emitted light.

19. The method according to claim 18, wherein the emitted light originates from an excited species and represents information on the status of the first and second ashing steps.

20. The method according to claim 18, wherein the emitted light originates from at least one of CO, a fluorine-containing species, or a combination thereof.

21. The method according to claim 20, wherein the fluorine-containing species is fluorine.

22. The method according to claim 1, wherein a length of the second ashing step is between 50% and 300% of the length of the first ashing step.

23. The method according to claim 1, wherein a flow rate of the process gas is between 5 sccm and 1500 sccm.

24. The method according to claim 1, wherein a flow rate of the hydrogen-containing gas is between 5 sccm and 500 sccm.

25. The method according to claim 2, wherein a flow rate of the hydrogen-containing gas is between 5 sccm and 500 sccm.

26. The method according to claim 1, wherein a flow rate of the process gas in the first ashing step is between 5 sccm and 1500 sccm.

27. The method according to claim 1, wherein a flow rate of the process gas in the second ashing step is between 5 sccm and 1500 sccm.

28. The method according to claim 1, wherein a flow rate of the process gas is varied between the first and second ashing steps.

29. The method according to claim 1, wherein the pressure in the processing chamber during the first ashing step is between about 1 mTorr and about 1000 mTorr.

30. The method according to claim 1, wherein the pressure in the processing chamber during the first ashing step is between about 5 mTorr and about 50 mTorr.

31. The method according to claim 1, wherein the pressure in the processing chamber during the second ashing step is less than about 10 mTorr.

32. The method according to claim 1, wherein the pressure in the processing chamber during the ashing step is less than about 5 mTorr.

33. The method according to claim 1, wherein the pressure in the processing chamber is varied between the first and second ashing steps.

34. The method according to claim 1, wherein the substrate comprises a low-k material, a photoresist, or etch residues, or a combination thereof.

35. The method according to claim 34, wherein the low-k material comprises a SiOC material.

36. The method according to claim 1, wherein the generating comprises applying a RF power through an impedance match network to an upper plate electrode of a plasma source.

37. The method according to claim 36, wherein the RF power applied to the upper plate electrode is between about 500 W and about 2200 W.

38. The method according to claim 1, wherein the generating comprises applying an RF power through an impedance match network to an inductive coil of a plasma source.

39. The method according to claim 38, wherein the RF power applied to the inductive coil is between about 50 W and about 10000 W.

40. The method according to claim 1, wherein the generating comprises applying a RF power to a rotating DC magnetic field power source.

41. A method of in-situ ashing, comprising:
introducing a process gas containing $H_2$ gas;
generating a plasma in a plasma processing chamber by applying a RF power through an impedance match network to an upper plate of a plasma source;
exposing a substrate to the plasma, the substrate containing a low-k material, photoresist, or etch residues, or a combination thereof, and being disposed on top of a substrate holder;
performing a first ashing step by applying a first bias between about 0 W and about 100 W to the substrate holder; and
performing a second ashing step by applying a second bias between about 50 W and about 1000 W to the substrate holder, wherein the second bias being greater than the first bias and a chamber pressure in the second ashing step is less than 20 mTorr.

42. The method according to claim 41, wherein the process gas further comprises a noble gas.

43. The method according to claim 41, wherein the RF power applied to the upper plate electrode is between about 500 W and about 2200 W.

* * * * *